(12) United States Patent
Chan et al.

(10) Patent No.: US 7,573,081 B2
(45) Date of Patent: Aug. 11, 2009

(54) METHOD TO FABRICATE HORIZONTAL AIR COLUMNS UNDERNEATH METAL INDUCTOR

(75) Inventors: Lap Chan, San Francisco, CA (US); Kok Wai Johnny Chew, Singapore (SG); Cher Liang Cha, Singapore (SG); Chee Tee Chua, Singapore (SG)

(73) Assignees: Chartered Semiconductor Manufacturing Ltd., Singapore (SG); National University of Singapore, Singapore (SG)

( * ) Notice: Subject to any disclaimer, the term of this patent is extended or adjusted under 35 U.S.C. 154(b) by 0 days.

(21) Appl. No.: 11/519,103

(22) Filed: Sep. 11, 2006

(65) Prior Publication Data
US 2007/0007623 A1 Jan. 11, 2007

Related U.S. Application Data

(62) Division of application No. 09/413,177, filed on Oct. 7, 1999, now Pat. No. 7,105,420.

(51) Int. Cl.
*H01L 29/78* (2006.01)
(52) U.S. Cl. ............... 257/276; 257/522; 257/E23.013; 257/410
(58) Field of Classification Search ........... 257/276, 257/522; 438/421, 422
See application file for complete search history.

(56) References Cited

U.S. PATENT DOCUMENTS 5,000,818 A * 3/1991 Thomas et al. ............. 438/619
5,171,713 A * 12/1992 Matthews ................... 438/31
5,413,962 A * 5/1995 Lur et al. ................... 438/619
5,481,131 A * 1/1996 Staudinger et al. ......... 257/531
5,539,241 A    7/1996 Abidi et al.
5,668,398 A * 9/1997 Havemann et al. ......... 257/522
5,828,121 A   10/1998 Lur et al.
5,844,299 A   12/1998 Merrill et al.
5,880,018 A    3/1999 Boeck et al.
5,880,026 A    3/1999 Xing et al.
6,140,197 A * 10/2000 Chu et al. .................. 438/381

FOREIGN PATENT DOCUMENTS

EP    0 812 016 A1   12/1997
EP    0 915 513 A1    5/1999

* cited by examiner

*Primary Examiner*—Jerome Jackson, Jr.
*Assistant Examiner*—Anthony Ho
(74) *Attorney, Agent, or Firm*—Saile Ackerman LLC; Stephen B. Ackerman; Rosemary L. S. Pike

(57) ABSTRACT

A new method is provided for creating an inductor on the surface of a silicon substrate. The invention provides overlying layers of oxide fins beneath a metal inductor. The oxide fins provide the stability support for the overlying metal inductor while also allowing horizontal air columns to simultaneously exist underneath the inductor. Overlying layers of air cavities that are spatially inserted between the created overlying layers of oxide fins can be created under the invention by repetitive application of the mask used. The presence of the air wells on the surface of the substrate significantly reduces parasitic capacitances and series resistance of the inductor associated with the substrate.

6 Claims, 5 Drawing Sheets

METHOD TO FABRICATE HORIZONTAL AIR COLUMNS UNDERNEATH METAL INDUCTOR

This is A DIVISIONAL APPLICATION of U.S. patent application Ser. No. 09/413,177, filed on Oct. 7, 1999 now U.S. Pat. No. 7,105,420, which is herein incorporated by reference in its entirety, and assigned to a common assignee.

BACKGROUND OF THE INVENTION (1) Field of the Invention

The invention relates to the fabrication of integrated circuit devices, and more particularly, to a method of forming air gaps under metal RF inductors that are used in the integration of RF Integrated Circuits on silicon substrates.

(2) Description of the Prior Art

In the fabrication of semiconductor devices, these devices can typically perform functions of digital data manipulation and data storage. In addition, these devices can also be used to serve as Radio Frequency (RF) amplifiers. Conventional RF amplifiers use a tuned circuit that consists of inductive and capacitive components. This tuned circuit can be used as a filter to filter out or remove signals of certain frequencies or to remove noise from a circuit configuration. The tuned circuit can also be used to form a high electrical impedance by using the LC resonance of the circuit and to thereby counteract the effect of parasitic capacitances that form part of a circuit. There are a number of significant advantages in integrating on one semiconductor monolithic substrate the functions of data manipulation and data storage with the indicated functions that are typically performed by a RF amplifier. For instance, manufacturing costs can be significantly reduced while power consumption for the combined functions is also limited. Inductors however typically are of significant size and therefore require a significant area of the semiconductor device to be implemented. The inductors are typically formed on the surface of a substrate in a spiral form. The physical size of the inductor that is created in this manner however makes the appearance of a significant amount of parasitic capacitances unavoidable. These parasitic capacitances exist between the inductor wiring and the underlying substrate. These parasitic capacitances have a serious negative effect on the functionality of the created LC circuit by sharply reducing the frequency of resonance of this circuit.

It is, as previously stated, desirable to be able to create the required inductance on the same monolithic substrate on which additional semiconductor devices are created (in order to realize the advantages that have been stated above). The parasitic capacitances that occur as part of this creation however limit the quality factor of the inductor that can be achieved using the conventional silicon process to about 10. This limitation is, for many applications, not acceptable. Dependent on the frequency at which the LC is designed to resonate, significantly larger values of quality factor, of for instance 100 or more, must be available. Prior Art has in this been limited to creating values of higher quality factor as separate units and integrating these separate units with the surrounding device functions. This negates the advantages that can be obtained when using the monolithic construction of creating both the inductor and the surrounding devices on one and the same semiconductor substrate. The non-monolithic approach also has the disadvantage that additional wiring is required to interconnect the sub-components of the assembly thereby again introducing additional parasitic capacitances and resistive losses over the interconnecting wiring network. For many of the applications of the RF amplifier, such as portable battery powered applications, power consumption is at a premium and must therefore be as low as possible. By raising the power consumption, the effects of parasitic capacitances and resistive power loss can be partially compensated but there are limitations to even this approach. These problems take on even greater urgency with the rapid expansion of wireless applications such as portable telephones and the like. Wireless communications is a rapidly expanding market where the integration of RF integrated circuits is one of the most important challenges. One of the approaches is to significantly increase the frequency of operation to for instance the range of 10 to 100 GHz. For such high frequencies, the values of the quality factor obtained from silicon-based inductors are significantly degraded. For applications in this frequency range, monolithic inductors have been researched using other than silicon as the base for the creation of the inductors. Such monolithic inductors have for instance been created using sapphire or GaAs as a base. These inductors have a considerably lower parasitic capacitance than their silicon counterparts and therefore provide higher frequencies of resonance of the LC circuit. Where however more complex applications are required, the need still exists to create inductors using silicon as a substrate. For those applications, the approach of using a base material other than silicon has proven to be too cumbersome while for instance GaAs as a medium for the creation of semiconductor devices is as yet a technical challenge that needs to be addressed.

The incorporation of RF inductors without sacrificing device performance due to substrate losses has been extensively researched in recent years. Some of the techniques that have been used for this approach include:

- the selective removing (by etching) of the silicon underneath the inductor (using methods of micro-machining)
- using multiple layers of metal (such as aluminum) interconnects or of copper damascene interconnects
- using a high resistivity silicon substrate
- employing biased wells underneath a spiral conductor
- inserting various types of patterned ground shields between the spiral inductor and the silicon substrate
- increasing the thickness of the inter-layer dielectric.

The above listing of researched alternatives is not meant to be complete or all inconclusive. All of the above approaches have as common objectives to:

1) enhance the quality (Q) value of the inductor, and
2) increase the frequency of the LC self-resonance thereby increasing the frequency range over which the inductor can be used.

The quality factor Q of an inductor can be described as follows: $Q=Es/El$ wherein Es is the energy that is stored in the reactive portion of the component while El is the energy that is lost in the reactive portion of the component. The better the quality of the component, the closer the resistive value of the component approaches zero while the Q factor of the component approaches infinity. The quality factor for components differs from the quality that is associated with filters or resonators. For components, the quality factor serves as a measure of the purity of the reactance (or the susceptance) of the component which can be degraded due to parasitics. In an actual configuration, there are always some physical resistors that will dissipate power thereby decreasing the power that can be recovered. The quality factor Q is dimensionless. A Q value of greater than 100 is considered very high for discrete inductors that are mounted on the surface of Printed Circuit Boards. For inductors that form part of an integrated circuit, the Q value is typically in the range between about 3 and 10.

As has previously been stated, the self-resonance that is caused by the parasitic capacitance between the (spiral)

inductor and the underlying substrate will limit the use of the inductor at high frequencies. Furthermore, the series spreading resistance associated with the substrate will degrade the Q factor of the inductor. This than has a direct effect on the usefulness of a monolithic or integrated inductor that is implemented on silicon substrates. This effect can be overcome if the area underneath the inductor can be made to appear locally insulating by selectively removing the underlying silicon resulting in inductors that are suspended in air. Air, having the lowest dielectric constant, forms an ideal barrier. The lowest possible and therefore the ideal dielectric constant is 1.0. This is the dielectric constant of a vacuum whereas air has a dielectric constant of slightly larger than 1.0.

The invention provides oxide fins beneath the metal inductor. The oxide fins provide the stability support for the overlying metal while also allowing horizontal air columns to simultaneously exist underneath the inductor. More than two air columns can be created by the technique presented in this invention by repetitive application of the mask used. The presence of the air wells on the surface of the substrate significantly reduces parasitic capacitances and series resistance associated with the substrate.

U.S. Pat. No. 5,828,121 (Lur et al.) shows air gaps between metal lines at different levels by etching the dielectric layers between the metal line levels. This is close to the invention.

U.S. Pat. No. 5,539,241 (Abidi et al.) and U.S. Pat. No. 5,844,299 (Merrill et al.) show air gaps under inductors.

U.S. Pat. No. 5,880,026 (Xing et al.) shows a process to form air gaps between conductors.

U.S. Pat. No. 5,880,018 (Boeck et al.) shows another air gap process between lines.

SUMMARY OF THE INVENTION

A principle objective of the invention is to provide a method of creating a high quality inductor on the surface of a silicon semiconductor substrate.

Another objective of the invention is to reduce parasitic capacitances associated with an inductor that is created on the surface of a silicon substrate.

Another objective of the invention is to reduce series resistance associated with the silicon substrate upon which the inductor is built.

A still further objective of the invention is to increase the value of the self-resonant frequency of an inductor-capacitor circuit that is created on the surface of a silicon substrate thereby increasing the usable frequency range of the inductor.

A still further objective of the invention is to decrease the real part of the impedance at resonance of an inductor-capacitor circuit that is created on the surface of a silicon substrate thereby increasing the quality value of the inductor.

In accordance with the objectives of the invention a new method is provided for creating an inductor on the surface of a silicon substrate. The invention provides overlying layers of oxide fins beneath a metal inductor. The oxide fins provide the stability support for the overlying metal inductor while allowing horizontal air columns to simultaneously exist underneath the inductor. Overlying layers of air cavities that are spatially inserted between the created overlying layers of oxide fins can be created under the invention by repetitive application of the mask used. The presence of the air wells on the surface of the substrate significantly reduces parasitic capacitances and series resistance associated with the substrate.

DESCRIPTION OF THE PREFERRED EMBODIMENTS

Figure 1:
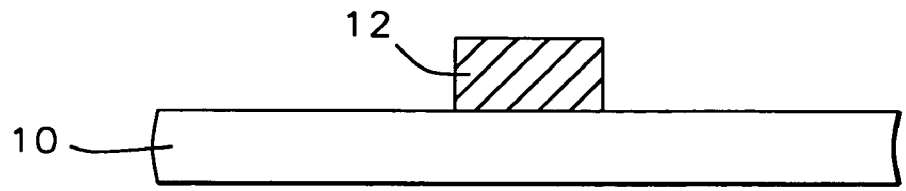
FIG. 1 shows a cross section of a layer of dielectric on the surface of which has been created a metal layer.

Referring now specifically to FIG. 1, there is shown a cross section of a layer 10 of either Inter Level Dielectric (ILD) or Inter Metal Dielectric (IMD) that forms a surface in the creation of a semiconductor device. The layer 10 can be deposited directly on the surface of a silicon substrate or it can be created as an overlying layer within the creation of a semiconductor device. Layer 10 can exist at any level within the creation of a semiconductor device.

Layer 10 can contain any suitable dielectric such as for instance silicon dioxide ("oxide", doped or undoped) or silicon nitride ("nitride"), silicon oxynitride, fluoropolymer, parylene, poyimide, tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), plasma enhanced silicon nitride (PSiNx), oxynitride, a low dielectric constant material, such as hydrogen silsesquioxane and HDP-FSG (high-density-plasma fluorine-doped silicate glass.

The most commonly used and therefore the preferred dielectrics are silicon dioxide (doped or undoped), silicon oxynitride, parylene or polyimide, spin-on-glass, plasma oxide or LPCVD oxide.

The deposition of the layer 10 of dielectric uses conventional deposition technology and can, for instance, be deposited using LPCVD, PECVD, or APCVD procedures at a temperature of between about 400 and 800 degrees C. to a thickness between about 5000 and 10000 Angstrom using TEOS as a source.

The metal layer 12 preferably has vertical sidewalls and can be composed of aluminum, tungsten, titanium copper polysilicon, polycide or alloys of these metal. Layer 12 preferably has a thickness of between about 3000 and 10,000 Angstrom and more preferably 4000 Angstrom. The layer 12 preferably has a width in the range between about 4000 and 8000 Angstrom and more preferably about 5000 Angstrom. A preferred process to form the metal layer 12 is a Ti/TiN/AlCu/TiN process.

The method used for forming the metal pattern 12 uses conventional deposition and planarization techniques. Standard photolithographic and RIE procedures, using $Cl_2$—$BCl_3$ as etchant, can be used to form the metal structure 12.

Figure 2:
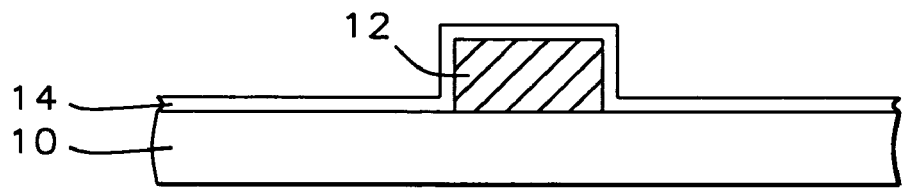
FIG. 2 shows a cross section after the deposition of a layer of oxide liner.

FIG. 2 shows a cross section after a thin layer 14 of oxide has been deposited over the surface of the dielectric layer 10. The function of layer 14 is to serve as stress relieve layer between the underlying layer 10 of dielectric and the overlying structure of the invention. Layer 14 can be deposited using PECVD at a temperature between about 350 and 450 degrees C. to a thickness between about 50 and 250 angstrom. Other materials that can be considered for layer 14 can contain materials such as TEOS (tetraethosiloxane), Plasma Enhanced TEOS (PETEOS), boron phosphate silicate glass (BPSG), borosilicate glass (BSG), phosphosilicate glass (PSG) or any other material that has the properties of a dielectric. Layer 14 is preferably formed by a plasma enhanced CVD deposition process.

Figure 3:
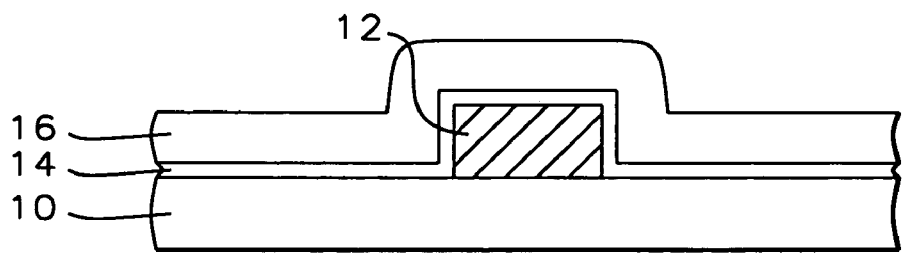
FIG. 3 shows a cross section after the deposition of a first layer of nitride.

FIG. 3 is a cross section after the layer 16 of nitride has been deposited over the surface of the layer 14 of oxide. Nitride is frequently used in the art as a structural dielectric layer. The layer 16 of nitride can be deposited using PECVD procedures at a pressure between about 200 mTorr and 2 Torr, at a temperature between about 350 and 450 degrees C., to a thickness between about 1000 and 5000 Angstrom using $NH_3$ and $SiH_4$.

Figure 4:
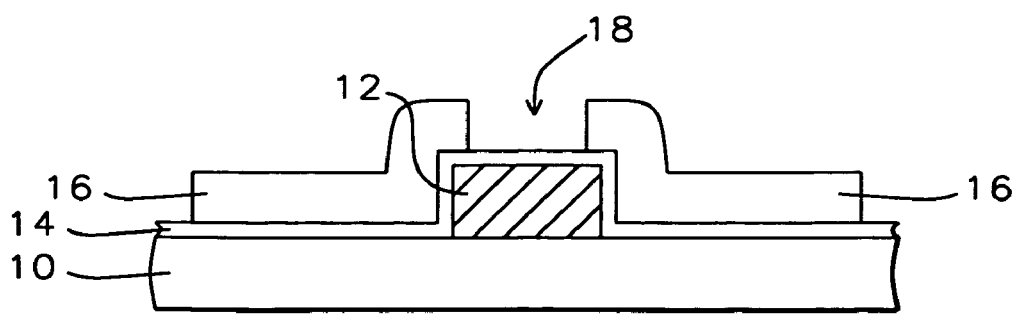
FIG. 4 shows a cross section after the creation of an opening in the first layer of nitride.

FIG. 4 shows a cross section after an opening has been etched in the first layer 16 of nitride. The opening 18 can be anisotropically etched with a plasma gas containing fluorcarbon gasses such as $CF_4$/$CHF_3$ chemistry or $Co$/$C_4F_8$ chemistry, in a commercial RIE etcher or an electron cyclotron resonance (ECR) plasma reactor. Nitride layer 16 can also be etched using hot $H_3PO_4$ as an etchant.

Figure 5:
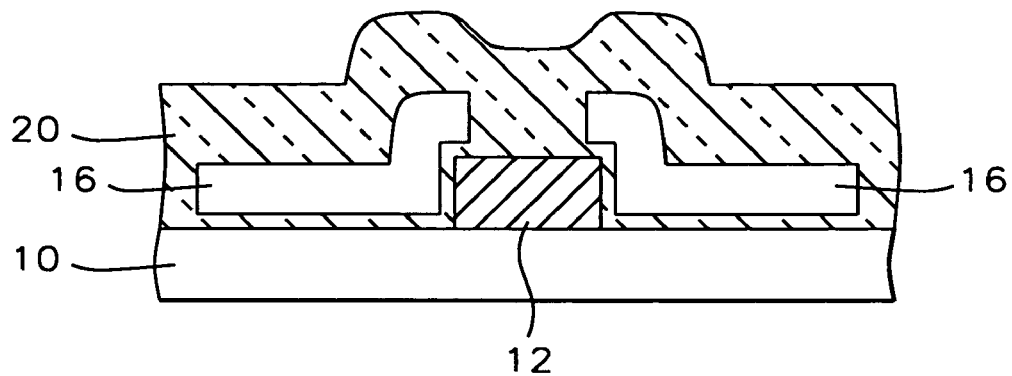
FIG. 5 shows a cross section after the deposition of a first layer of oxide.

FIG. 5 shows a cross section after a first layer 20 of oxide has been deposited over the surface of layer 16 of nitride thereby including the inside of opening 18. The method of deposition of layer 20 can use conventional PECVD deposition at a temperature between about 350 and 450 degrees C. and a pressure between about 200 mTorr and 2 Torr, deposited to a thickness between about 5000 and 10,000 Angstrom. The layer 20 of oxide can also be deposited using APCVD, LPCVD or PECVD processing at a temperature between about 350 and 450 degrees C.

Figure 6:
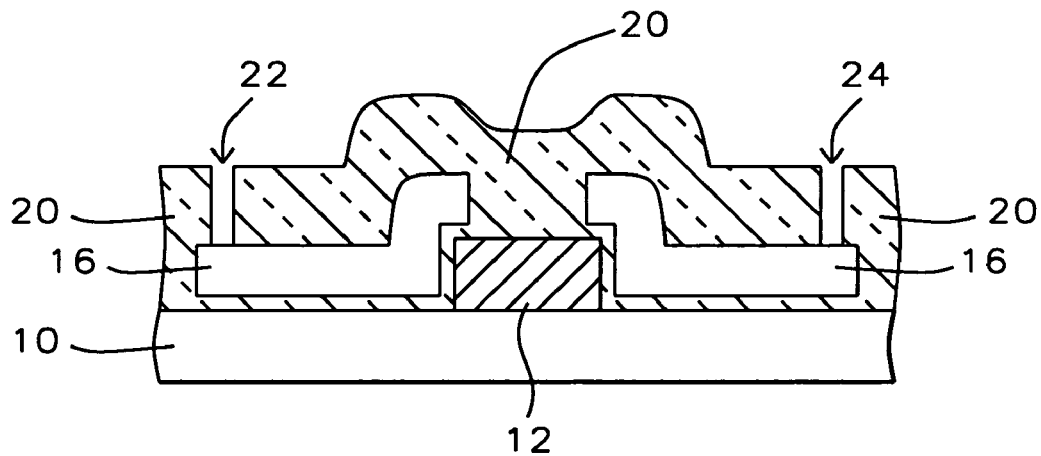
FIG. 6 shows a cross section after the creation of openings in the first layer of oxide.

FIG. 6 shows a cross section after openings 22 and 24 have been etched through the first layer of oxide 20. It is to be noted that these openings penetrate the layer 20 of first oxide down to the surface of the first layer 16 of nitride. These openings will, during following steps of the process of the invention, be filled with nitride forming columns of nitride that support the overlying structure of the invention. Standard photolithography and RIE procedures, using $CF_4$/$CHF_3$ as etchants, are used to create the openings 22 and 24.

Figure 7:
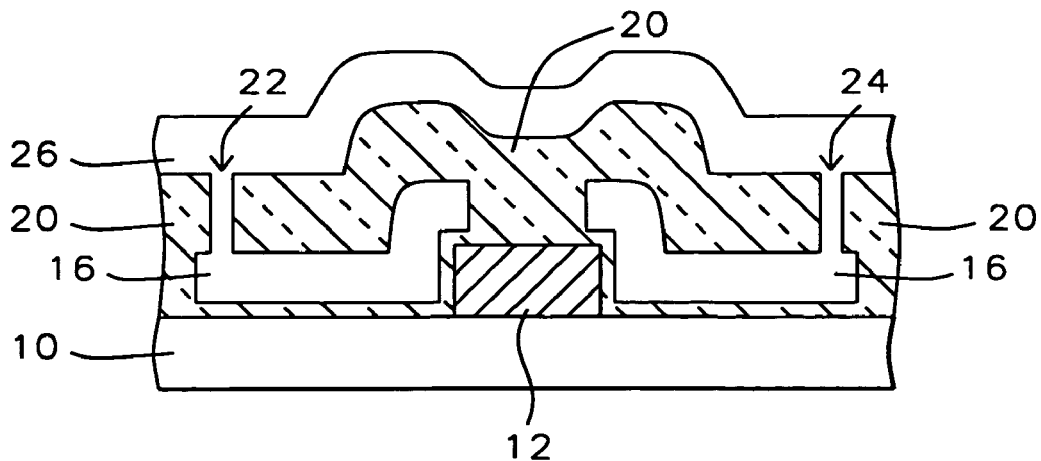
FIG. 7 shows a cross section after the deposition of a second layer of nitride.

FIG. 7 shows a cross section after a second layer 26 of nitride has been deposited over the surface of the first oxide layer 20 thereby also filling openings 22 and 24 with nitride. The layer 26 of nitride can be deposited using PECVD procedures at a pressure between about 200 mTorr and 2 Torr, at a temperature between about 350 and 450 degrees C., to a thickness between about 1000 and 5000 Angstrom.

Figure 8:
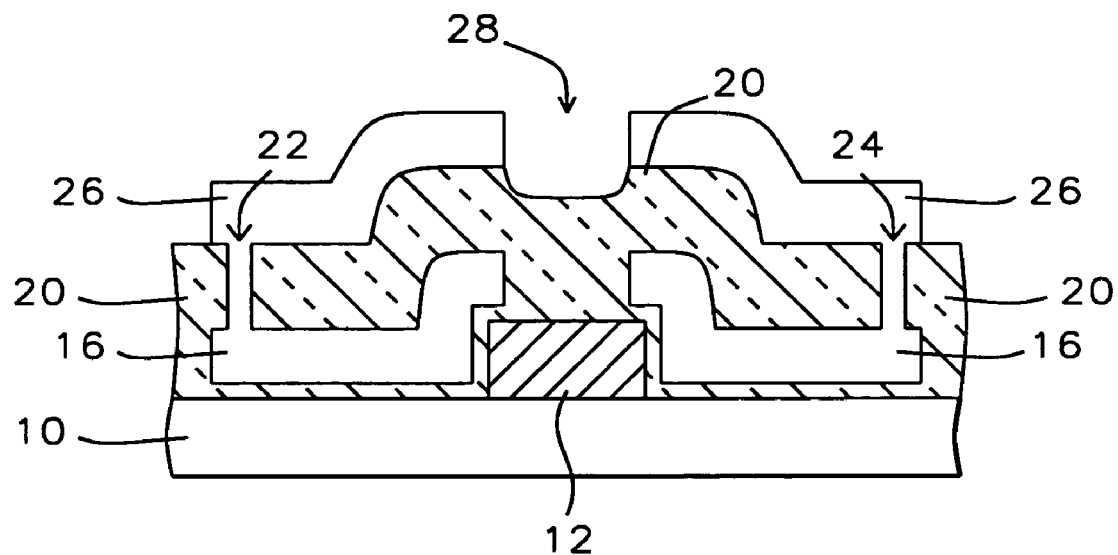
FIG. 8 shows a cross section after the creation of an opening in the second layer of nitride.

FIG. 8 shows a cross section after the layer 26 of nitride has been etched thereby forming opening 28 in the layer 26 of nitride. It must be noted that the opening is aligned with the opening 18 (FIG. 4) which has been aligned with the metal pattern 12. The opening 28 can be anisotropically etched with a plasma gas containing $CF_4$/$CHF_3$, in a commercial RIE etcher or an electron cyclotron resonance (ECR) plasma reactor.

Figure 9:
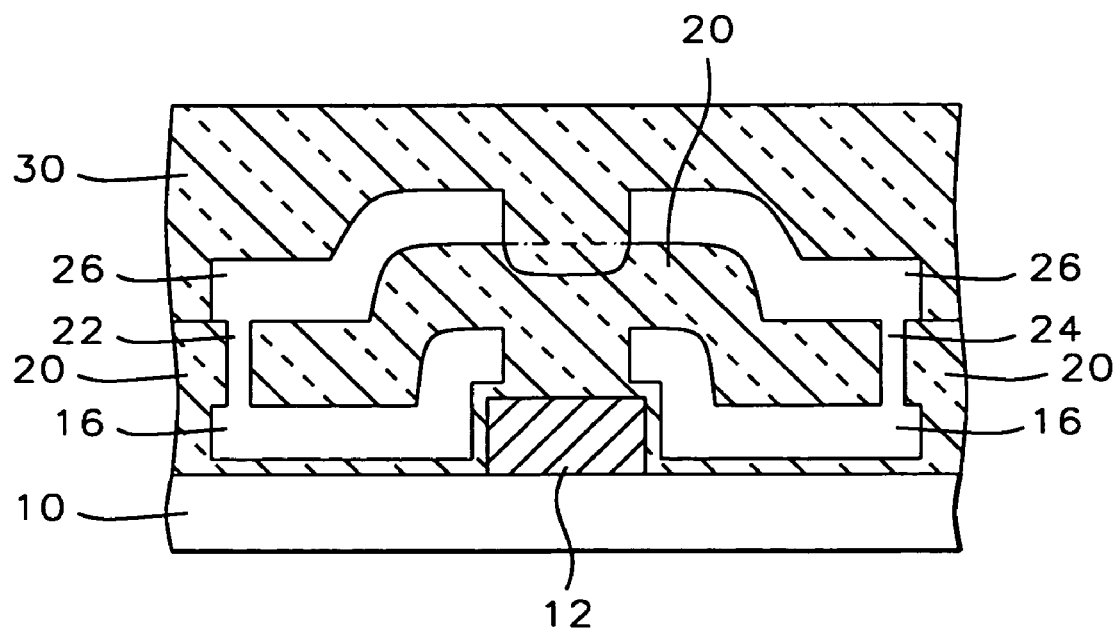
FIG. 9 shows a cross section after the deposition of a second layer of oxide.

FIG. 9 shows a cross section after the second layer 30 of oxide has been deposited over the surface of the second layer 26 of nitride thereby filling the opening 28 (FIG. 8). The method and processing conditions that are applied for the deposition of layer 30 are the same as previously detailed for the deposition of the first layer 20 of oxide, FIG. 5. These parameters will therefore not be further discussed at this point. If required, CMP will be used to planarize layer 30.

Figure 10:
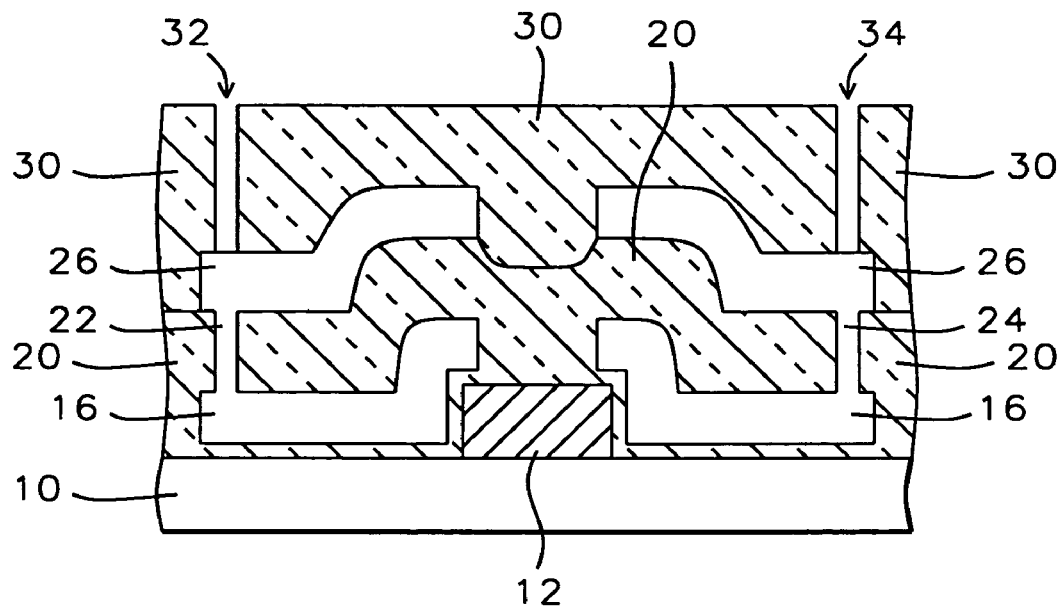
FIG. 10 shows a cross section after the creation of openings in the second layer of oxide.

FIG. 10 shows a cross section after the second layer 30 of oxide has been etched thereby creating the openings 32 and 34. The parameters and operating conditions that are applied for this etch are the same as have previously detailed for the etch of openings 22 and 24, FIG. 6. These parameters therefore need not further be discussed at this point. It must be noted that openings 32 and 34 align with openings 22 and 24 (FIG. 6) that have previously been created in the first layer 20 of oxide. It must further be noted that the layers of nitride of the first layer 16 and the second layer 26 are accessible by means of the openings 32 and 34.

Figure 11:
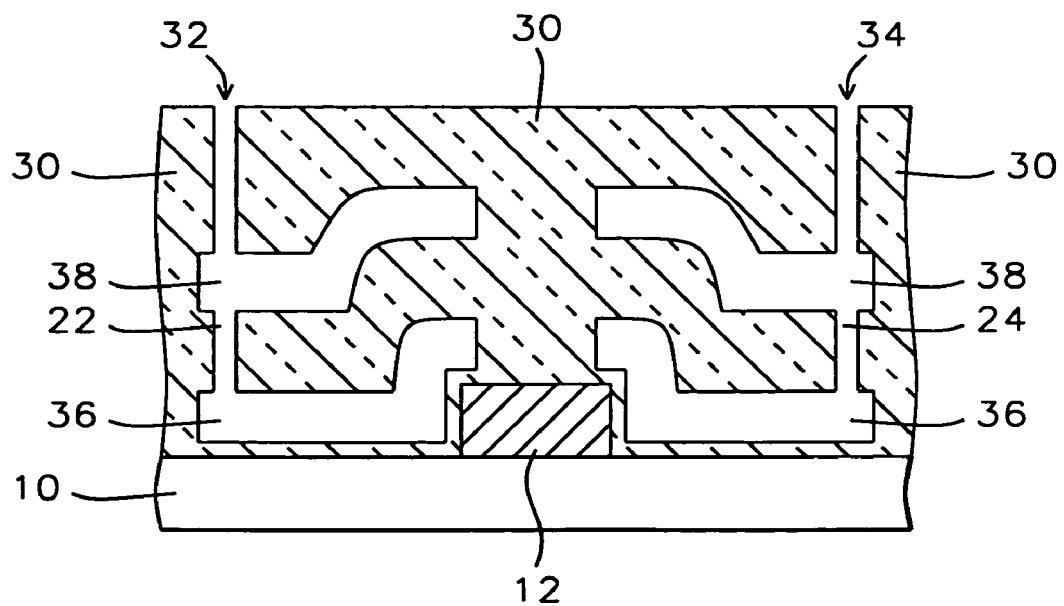
FIG. 11 shows a cross section after the removal of the layers of nitride.

FIG. 11 shows a cross section after the nitride of the first layer 16 and the nitride of the second layer 26 have been removed from the structure. The structure is dipped into hot phosphoric acid ($H_3PO_4$) in order for the nitride to be removed (wet nitride removal). The removal of the nitride of the first layer 16 of nitride creates the air gaps 36; the removal of the nitride of the second layer 26 of nitride creates the air gaps 38. The air gaps 36 and 38 are interconnected via openings 22 and 24 while air gaps 38 are, at this time, connected to the surface of the structure via openings 32 and 34.

Figure 12:
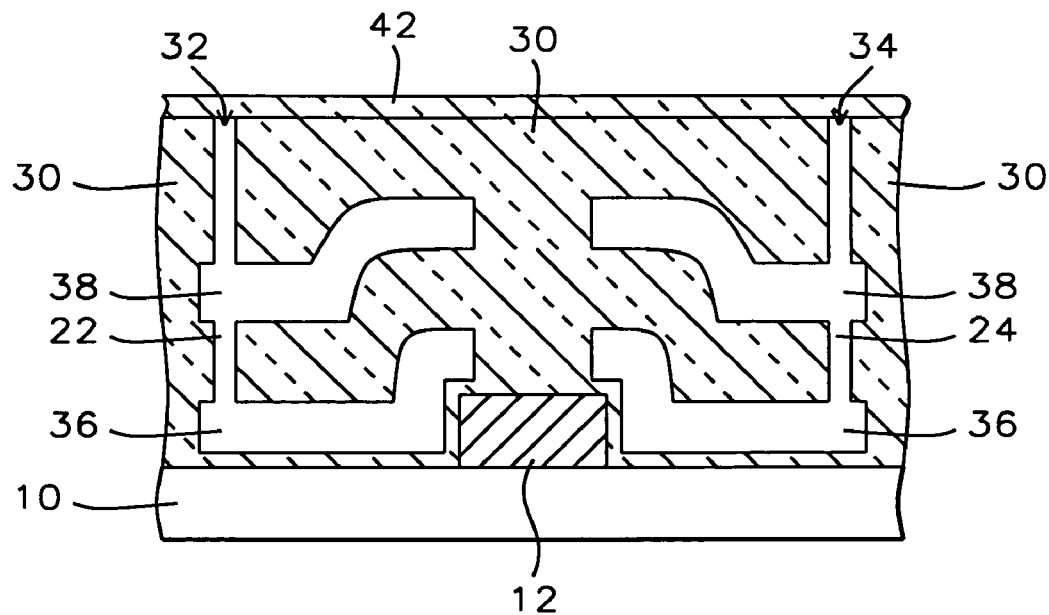
FIG. 12 shows a cross section after the deposition of a thin layer of CVD oxide.

FIG. 12 shows a cross section after a thin layer 42 of oxide is deposited over the surface of the structure. This thin layer of oxide is required to close the openings 32 and 34 thereby making the structure a self contained and complete structure and thereby furthermore enclosing the air gaps 36 and 38. Methods and techniques that can be used to deposit this thin layer 42 of oxide have previously been detailed and do therefore not need to be discussed any further at this point. The thickness of the thin oxide layer 42 is to be optimized such that adequate surface tension can be created such that the oxide of this layer 42 does not penetrate into openings 32 and 34 or into the air gaps 36 and 38 that have been created by the removal of the first and second layer of nitride.

Figure 13:
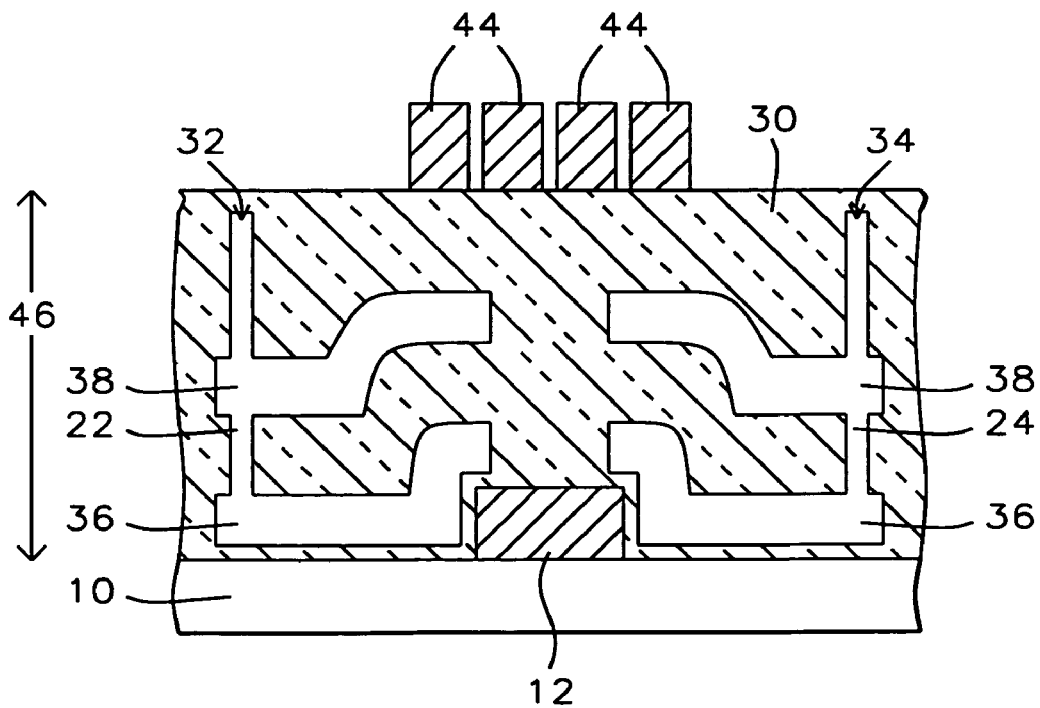
FIG. 13 shows a cross section after the patterning and creation of the top metal of the inductor over the surface of the CVD oxide.

FIG. 13 shows a cross section of the structure after the inductor 44 has been formed on the surface of the thin layer 42 of oxide. Conventional methods can be used for the creation of the inductor; the previously indicated Ti/TiN/AlCu/TiN process is also the preferred method to form the inductor. Layer 12 of the structure serves as the electrical point of reference (zero point or ground) or the inner port for the inductor 44. Electrically conductive materials that can be used for the inductor 44 include but are not limited to Al, Ti, Ta, W, Mo, Cu, polysilicon or a combination of these materials.

The parameter 46, which is the total thickness of the construction of the invention that has been discussed up to this point, can be controlled in order to control the parasitic capacitance of the inductor 44 with respect to the underlying layer 10 of ILD/IMD. By increasing the value of 46, the dielectric constant of the created structure decreases, which results in a decrease of the parasitic capacitance. This increase of the value of 46 can be accomplished by increasing the thickness of the layer 42 (FIG. 12) of deposited oxide or by increasing the number of cavities (identical to cavities 36 and 38) that are created as part of the structure. The increased number of cavities can be created using the same masks that have been used for the creation of cavities 36 and 38. The structure that is shown in FIG. 13 contains two levels of cavities, that is cavities 36 and 38. The invention is not limited to two levels of cavities but can, by continuation of the processing steps that have been highlighted for the creation of the two cavities, be extended to additional cavities. The total number of cavities of the structure is determined by the functional requirements that are imposed on the creation of the inductor 44 in accordance with the design considerations that have previously been indicated.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. An integrated circuit comprising:
   a semiconductor substrate;
   a metal layer formed over the semiconductor substrate;
   a dielectric layer formed over the metal layer, the dielectric layer comprising:
      a first and second layer of horizontal air gap, the second layer of horizontal air gap overlying the first layer of horizontal air gap;
      a first horizontal portion of the dielectric layer sandwiched between the first and second layer of horizontal air gap, wherein the first and second layers of horizontal air gap are spaced apart by the first horizontal portion of the dielectric layer; and
      a plurality of first and second openings extending through the first horizontal portion of the dielectric layer, wherein the first and second layers of horizontal air gap are interconnected via the first and second openings.

2. The integrated circuit according to claim 1, further comprising:
   a second horizontal portion of the dielectric layer formed over the second layer of horizontal air gap; and
   a plurality of third and fourth openings extending through the second horizontal portion of the dielectric layer, the third and fourth openings being aligned with the first and second openings, enabling creation of the first and second layers of horizontal air gap.

3. The integrated circuit according to claim 2, further comprising a cap layer formed over the second horizontal portion of the dielectric layer, the cap layer closing the third and fourth openings.

4. The integrated circuit according to claim 2, further comprising:
   a third layer of horizontal air gap overlying the second horizontal portion of the dielectric layer;
   wherein the second horizontal portion of the dielectric layer spatially separates the second and third layers of horizontal air gap and the third layer of horizontal air gap is interconnected to the second layer of horizontal air gap via the third and fourth openings.

5. The integrated circuit according to claim 1, wherein the dielectric layer comprises an oxide layer.

6. The integrated circuit according to claim 1, further comprising an inductor formed over the dielectric layer.

* * * * *